United States Patent
Yamashita et al.

(10) Patent No.: US 10,049,934 B2
(45) Date of Patent: Aug. 14, 2018

(54) WAFER PROCESSING METHOD

(71) Applicant: DISCO CORPORATION, Tokyo (JP)

(72) Inventors: Yohei Yamashita, Tokyo (JP); Tsubasa Obata, Tokyo (JP); Yuki Ogawa, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/799,567

(22) Filed: Oct. 31, 2017

(65) Prior Publication Data

US 2018/0122700 A1 May 3, 2018

(30) Foreign Application Priority Data

Nov. 2, 2016 (JP) .................. 2016-215459

(51) Int. Cl.
*H01L 21/78* (2006.01)
*H01L 21/683* (2006.01)
*H01L 21/268* (2006.01)

(52) U.S. Cl.
CPC .......... *H01L 21/78* (2013.01); *H01L 21/2686* (2013.01); *H01L 21/6836* (2013.01); *H01L 2221/68327* (2013.01)

(58) Field of Classification Search
CPC . H01L 21/302; H01L 21/304; H01L 21/3043; H01L 21/3046; H01L 21/78–21/786; H01L 21/2686; H01L 21/6836; H01L 2221/68327; B24B 7/228; B24B 9/065; B24B 1/00–1/04; B23K 26/00–26/70
See application file for complete search history.

(56) References Cited

U.S. PATENT DOCUMENTS

| | | | | |
|---|---|---|---|---|
| 5,284,792 | A * | 2/1994 | Forster | H01S 5/0201 148/DIG. 28 |
| 6,939,785 | B2 * | 9/2005 | Kajiyama | H01L 21/6835 257/E21.505 |
| 7,863,159 | B2 * | 1/2011 | Co | H01L 21/6836 257/E21.599 |
| 9,209,085 | B2 * | 12/2015 | Uchida | H01L 21/6835 |
| 2010/0041210 | A1 * | 2/2010 | Hoshino | H01L 21/67092 438/463 |
| 2015/0187650 | A1 * | 7/2015 | Uchida | H01L 21/6835 438/463 |

(Continued)

FOREIGN PATENT DOCUMENTS

JP 2005-064231 3/2005

*Primary Examiner* — Scott B Geyer
(74) *Attorney, Agent, or Firm* — Greer, Burns & Crain, Ltd.

(57) ABSTRACT

A wafer processing method divides a wafer into individual device chips along division lines. The method includes attaching an adhesive tape to the front side of the wafer and attaching a peripheral portion of the adhesive tape to an annular frame having an inside opening for receiving the wafer, thereby supporting the wafer through the adhesive tape to the annular frame; grinding the back side of the wafer to reduce the thickness of the wafer; cutting the back side of the wafer along each division line by using a cutting blade to form a cut groove having a depth not reaching the front side of the wafer; and applying a laser beam to the bottom of the cut groove from the back side of the wafer along each division line to divide the wafer to obtain the individual device chips.

1 Claim, 6 Drawing Sheets

(56) References Cited

U.S. PATENT DOCUMENTS

2016/0148842 A1*  5/2016  Ho .................... H01L 21/78
                                            257/620
2017/0117434 A1*  4/2017  Ogawa ............ H01L 21/6836

* cited by examiner

WAFER PROCESSING METHOD

BACKGROUND OF THE INVENTION

Field of the Invention

The present invention relates to a wafer processing method for dividing a wafer into a plurality of individual device chips along a plurality of division lines, the division lines being formed on the front side of the wafer to thereby define a plurality of separate regions where a plurality of devices are individually formed.

Description of the Related Art

A plurality of devices such as integrated circuits (ICs), large-scale integration (LSI) circuits are formed on the front side of a wafer so as to be separated by a plurality of crossing division lines. The wafer thus having the devices on the front side is divided into individual device chips along the division lines by using a dicing apparatus having a cutting blade. These device chips are used in various electrical equipment such as mobile phones and personal computers.

In recent years, increasing the processing speed of each device has been desired and it is known that a plurality of low-permittivity insulator films called low-k films are stacked as interlayer insulating films on the front side of a semiconductor substrate such as a silicon wafer, thereby forming a functional layer including the devices such as ICs and LSIs. Thus, the functional layer including the plural low-k films stacked is formed on the whole surface of the front side of the wafer. Accordingly, the functional layer is also formed on each division line. When the functional layer formed on each division line is cut by using a cutting blade, there arises a problem such that the low-k films stacked may be separated from each other (delamination), causing a degradation in device quality.

To solve this problem, there has been proposed and put into practical use a wafer dividing method including the steps of applying a laser beam to the front side of a wafer along each division line to thereby remove a functional layer including low-k films from each division line and next cutting (dicing) the wafer along each division line where the functional layer has been removed, by using a cutting blade to thereby divide the wafer into individual device chips (see Japanese Patent Laid-open No. 2005-064231, for example).

SUMMARY OF THE INVENTION

According to the method described in Japanese Patent Laid-open No. 2005-064231, it is possible to solve the problem occurring in the case of directly removing the functional layer by dicing. However, at least two laser processed grooves must be formed along each division line, so as to remove the functional layer having a width greater than the width (thickness) of the cutting blade and thereby prevent the interference of the cutting blade with the functional layer. As a result, there is a problem that the productivity may be reduced.

Furthermore, the following problems have been found in performing the method described in Japanese Patent Laid-open No. 2005-064231.

(1) When the removal of the functional layer from each division line is insufficient in performing laser grooving such that the laser beam is applied to the front side of the wafer to remove the functional layer from each division line, the cutting blade may be deviated or tilted or uneven wearing of the cutting blade may occur in dicing the wafer after laser grooving.

(2) When the laser beam is applied to the front side of the wafer to form the laser processed grooves in laser grooving, debris may scatter and stick to the front side of the wafer, causing a degradation in device quality. Accordingly, a protective film must be formed on the front side of the wafer, causing a reduction in productivity.

(3) The laser beam must be applied in plural passes along each division line to form the laser processed grooves along each division line. As a result, thermal strain remains in the wafer to cause a reduction in die strength of each device chip.

(4) Since the spacing between the two laser processed grooves along each division line is larger than the width of the cutting blade, the width of each division line must be increased to cause a decrease in device forming area, i.e., a decrease in number of devices that can be formed on the wafer.

(5) A passivation film of SiN or $SiO_2$ is formed on the front side (upper surface) of the functional layer, so as to protect the functional layer from ambient moisture or metal ions. Accordingly, when a laser beam is applied to the wafer from the front side thereof, the laser beam passes through the passivation film to process the functional layer. As a result, the energy of the laser beam is confined in the functional layer by the passivation film, so that there is a possibility of so-called undercut such that the low-k films may be separated from each other (delamination) and the processing by the laser beam may spread to the functional layer in each device, causing a degradation in device quality.

It is therefore an object of the present invention to provide a wafer processing method which can efficiently divide a wafer into individual device chips without a degradation in device quality, in which a plurality of interlayer insulating films are stacked on the front side of the wafer to form a functional layer having a plurality of devices, and the devices are separated from each other by a plurality of crossing division lines.

In accordance with an aspect of the present invention, there is provided a wafer processing method for dividing a wafer into a plurality of individual device chips along a plurality of crossing division lines, the division lines being formed on the front side of the wafer to thereby define a plurality of separate regions where a plurality of devices are individually formed, the device chips corresponding to the respective devices, the wafer processing method including a wafer supporting step of attaching an adhesive tape to the front side of the wafer and attaching a peripheral portion of the adhesive tape to an annular frame having an inside opening for receiving the wafer, thereby supporting the wafer through the adhesive tape to the annular frame; a back grinding step of grinding the back side of the wafer to thereby reduce the thickness of the wafer after performing the wafer supporting step; a cut groove forming step of cutting the back side of the wafer along each division line by using a cutting blade after performing the back grinding step, thereby forming a cut groove on the back side of the wafer along each division line, the cut groove having a depth not reaching the front side of the wafer; a dividing step of applying a laser beam to the bottom of the cut groove from the back side of the wafer along each division line after performing the cut groove forming step, thereby dividing the wafer along each division line to obtain the individual device chips; and a pickup step of picking up each device chip from the adhesive tape after performing the dividing step.

According to the wafer processing method of the present invention, it is unnecessary to form a plurality of laser processed grooves along each division line on the front side of the wafer, thereby improving the productivity and solving the above problems. Furthermore, the back side of each device chip can be held under suction by a pickup collet and then picked up from the adhesive tape in the pickup step. Accordingly, the front side of each device chip picked up by the pickup collet can be bonded as it is to a wiring board, thereby further improving the productivity.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
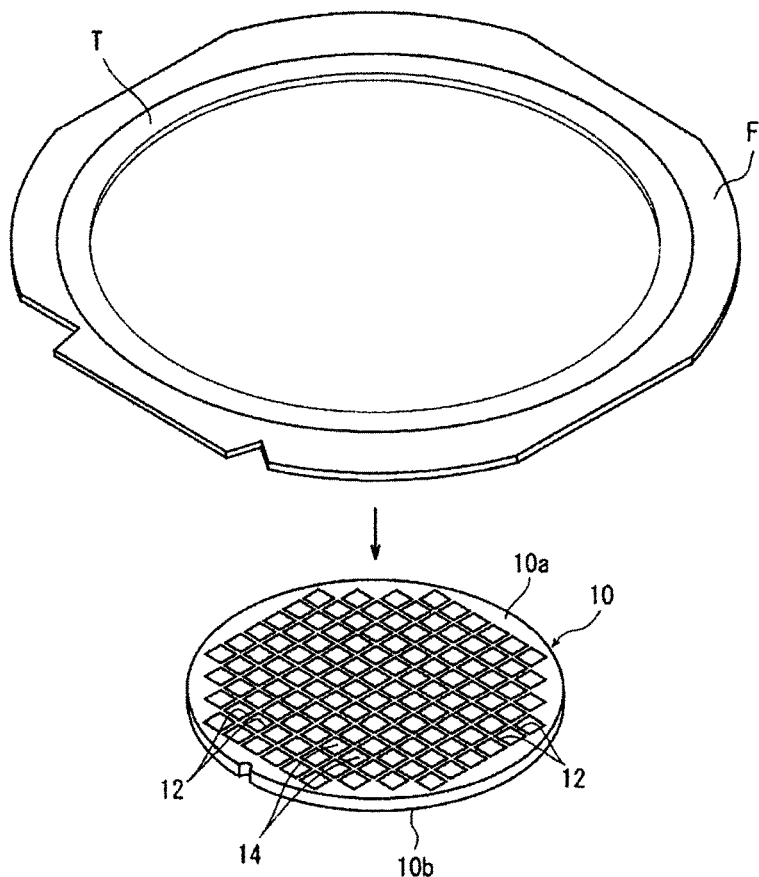
FIG. 1A is a perspective view illustrating a wafer supporting step.
Figure 1B:
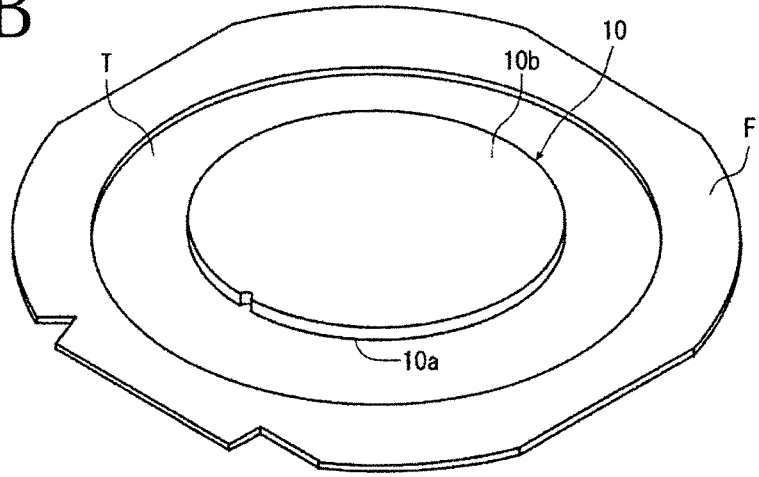
FIG. 1B is a perspective view of a wafer supported through an adhesive tape to an annular frame as obtained by the wafer supporting step.

A preferred embodiment of the wafer processing method according to the present invention will now be described in detail with reference to the attached drawings. FIGS. 1A and 1B illustrate a wafer supporting step of supporting a wafer 10 through an adhesive tape T to an annular frame F. More specifically, as illustrated in FIG. 1A, the wafer 10 has a front side 10a and a back side 10b. The adhesive tape T is attached to the front side 10a of the wafer 10. A peripheral portion of the adhesive tape T is previously attached to an annular frame F having an inside opening for receiving the wafer 10. That is, the inside opening of the annular frame F is closed by a central portion of the adhesive tape T, and this central portion of the adhesive tape T is attached to the front side 10a of the wafer 10. Thus, the wafer 10 is supported through the adhesive tape T to the annular frame F. After supporting the wafer 10 through the adhesive tape T to the annular frame F, the back side 10b of the wafer 10 is oriented upward as illustrated in FIG. 1B. That is, the back side 10b of the wafer 10 supported through the adhesive tape T to the annular frame F is exposed upward. In this manner, the wafer supporting step is finished. The wafer 10 illustrated in FIGS. 1A and 1B is formed from a silicon substrate having a thickness of 700 µm, for example. A plurality of crossing division lines 12 are formed on the front side 10a of the wafer 10 to thereby define a plurality of separate regions where a plurality of devices 14 such as ICs and LSIs are individually formed.

Figure 2:
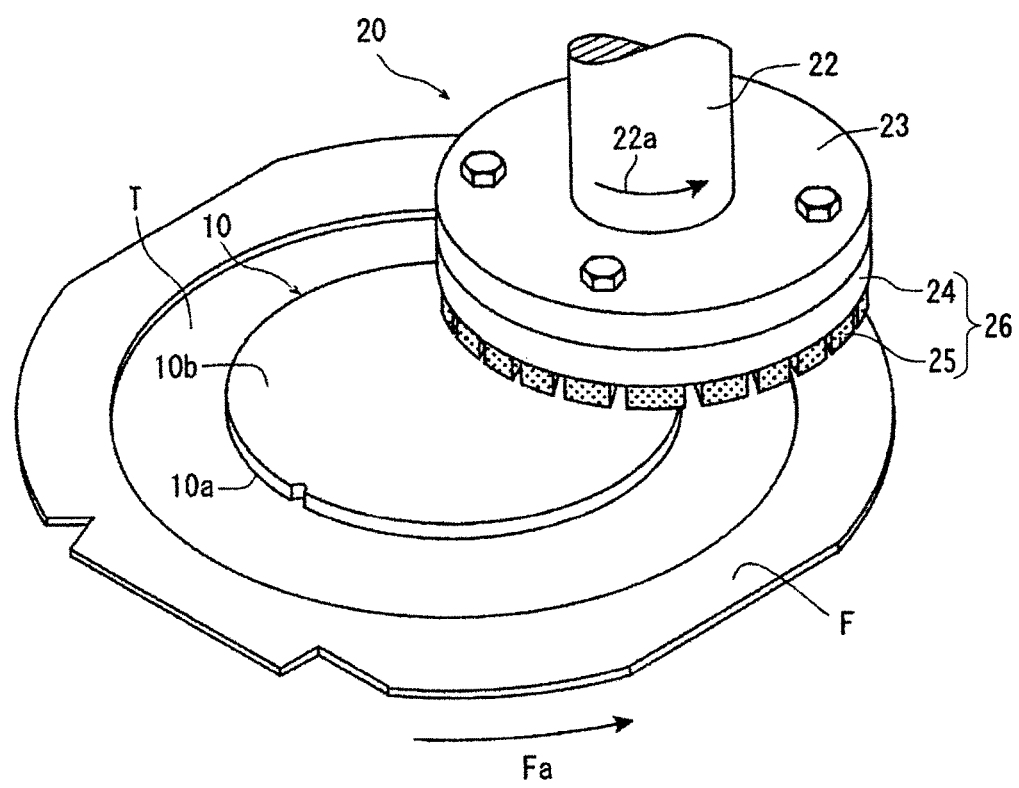
FIG. 2 is a perspective view illustrating a back grinding step.

After performing the wafer supporting step, a back grinding step is performed to grind the back side 10b of the wafer 10 as illustrated in FIG. 2. First, the wafer 10 supported through the adhesive tape T to the annular frame F is placed on a chuck table (not illustrated) included in a grinding apparatus (not illustrated in a general view) in the condition where the adhesive tape T attached to the front side 10a of the wafer 10 is in contact with the upper surface of the chuck table and the back side 10b of the wafer 10 is oriented upward. The chuck table is adapted to be rotated by a rotational drive mechanism (not illustrated). The upper surface of the chuck table functions as a holding surface for holding the wafer W under suction. This holding surface of the chuck table is formed of a porous material, and it is connected to suction means (not illustrated) for producing a vacuum. Accordingly, the wafer 10 placed on the chuck table is held under suction on the holding surface of the chuck table by operating the suction means, thereby preventing possible displacement of the wafer 10 on the chuck table during a grinding operation to be hereinafter described.

As illustrated in FIG. 2, the grinding apparatus includes grinding means 20 for grinding the back side 10b of the wafer 10 held on the chuck table under suction to thereby reduce the thickness of the wafer 10. The grinding means 20 includes a spindle 22 adapted to be rotated by a rotational drive mechanism (not illustrated), a mounter 23 fixed to the lower end of the spindle 22, and a grinding wheel 26 mounted on the lower surface of the mounter 23. The grinding wheel 26 is composed of an annular wheel base 24 and a plurality of abrasive members 25 fixed to the lower surface of the wheel base 24 so as to be arranged annularly. Although not essential in the grinding apparatus, a plurality of (e.g., four) clamps for holding the annular frame F are preferably provided on the outer circumference of the chuck table. In this case, the annular frame F supporting the wafer 10 through the adhesive tape T is held by the clamps, and the annular frame F is preferably set at a level lower than the level of the holding surface of the chuck table, i.e., the level of the wafer 10 held on the holding surface of the chuck table. With this arrangement, it is possible to prevent that the abrasive members 25 may come into contact with the annular frame F in the back grinding step. That is, there is no possibility that the annular frame F may interfere with the grinding operation of the grinding wheel 26.

In the condition where the wafer 10 is held through the adhesive tape T on the chuck table under suction, the chuck table is rotated at 300 rpm, for example, in the direction illustrated by an arrow Fa in FIG. 2, and at the same time the grinding wheel 26 (i.e., the spindle 22) is rotated at 6000 rpm, for example, in the direction illustrated by an arrow 22a in FIG. 2. Thereafter, the grinding means 20 is lowered to bring the abrasive members 25 into contact with the back side 10b of the wafer 10. Further, the grinding wheel 26 is fed downward at a feed speed of 1 µm/second, for example, in the direction perpendicular to the upper surface of the chuck table. At this time, the thickness of the wafer 10 is measured by using a contact type measuring gauge (not illustrated) during the grinding operation. Thus, the back side 10b of the wafer 10 is ground by the abrasive members 25 until the thickness of the wafer 10 is reduced to a predetermined thickness (e.g., 200 µm). When the thickness of the wafer 10 has reached the predetermined thickness, the back grinding step is finished.

Figure 3A:
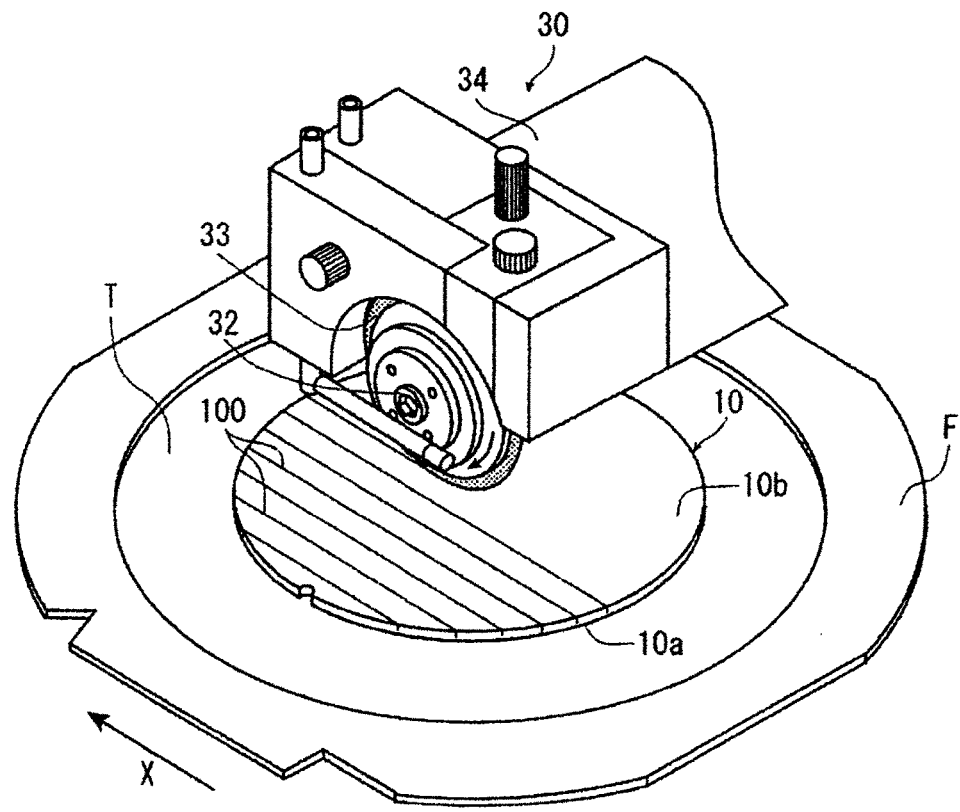
FIG. 3A is a perspective view illustrating a cut groove forming step.

After performing the back grinding step, a cut groove forming step is performed to cut the back side 10b of the wafer 10 along each division line 12 by using a cutting apparatus (not illustrated in a general view) having cutting means 30 illustrated in FIG. 3A. First, the wafer 10 processed by the back grinding step mentioned above is transferred to the cutting apparatus. That is, the wafer 10 is placed on a chuck table (not illustrated) included in the cutting apparatus in the condition where the back side 10b of the wafer 10 is oriented upward. That is, the adhesive tape T attached to the front side 10a of the wafer 10 is in contact with the upper surface (holding surface) of the chuck table in the cutting apparatus. The chuck table is set below the cutting means 30 as illustrated in FIG. 3A. As in the case of the grinding apparatus mentioned above, the holding surface of the chuck table in the cutting apparatus is connected to suction means for producing a vacuum, so that the wafer 10 placed on the chuck table is held under suction by operating the suction means. Further, a plurality of (e.g., four) clamps for holding the annular frame F are preferably provided on the outer circumference of the chuck table in the cutting apparatus. In this case, the annular frame F supporting the wafer 10 through the adhesive tape T is held by the clamps, and the annular frame F is preferably set at a level lower than the level of the holding surface of the chuck table.

As illustrated in FIG. 3A, the cutting means 30 includes a spindle housing 34, a spindle 32 rotatably supported in the spindle housing 34, and a cutting blade 33 fixed to the front end portion of the spindle 32. The cutting apparatus further includes imaging means (not illustrated) for imaging the front side 10a of the wafer 10 from the back side 10b thereof by applying infrared light to detect the division lines 12 formed on the front side 10a of the wafer 10. In the condition where the wafer 10 is held on the chuck table under suction, alignment is performed by using this imaging means in such a manner that a target one of the division lines 12 is aligned with the cutting blade 33. Thereafter, the cutting blade 33 is rotated at a high speed and then lowered according to the position information obtained by the above alignment to thereby cut the back side 10b of the wafer 10 at the position corresponding to the target division line 12. Thereafter, the chuck table is moved relative to the cutting blade 33 in a feeding direction (the direction illustrated by an arrow X in FIG. 3A). Accordingly, as illustrated in FIG. 3B which is an enlarged sectional view of an essential part of the wafer 10 cut by the cutting blade 33, a cut groove 100 is formed on the back side 10b of the wafer 10 along the target division line 12, in which the cut groove 100 has a predetermined depth from the back side 10b of the wafer 10 to a predetermined vertical position not reaching the front side 10a of the wafer 10, and the cut groove 100 has a predetermined width (e.g., 30 μm).

Figure 3B:
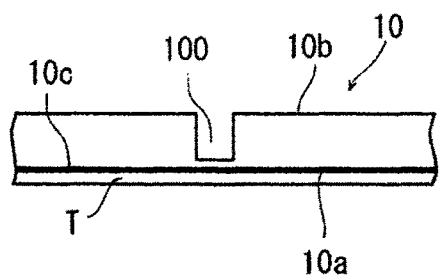
FIG. 3B is an enlarged sectional view of an essential part of the wafer processed by the cut groove forming step.
Figure 4:
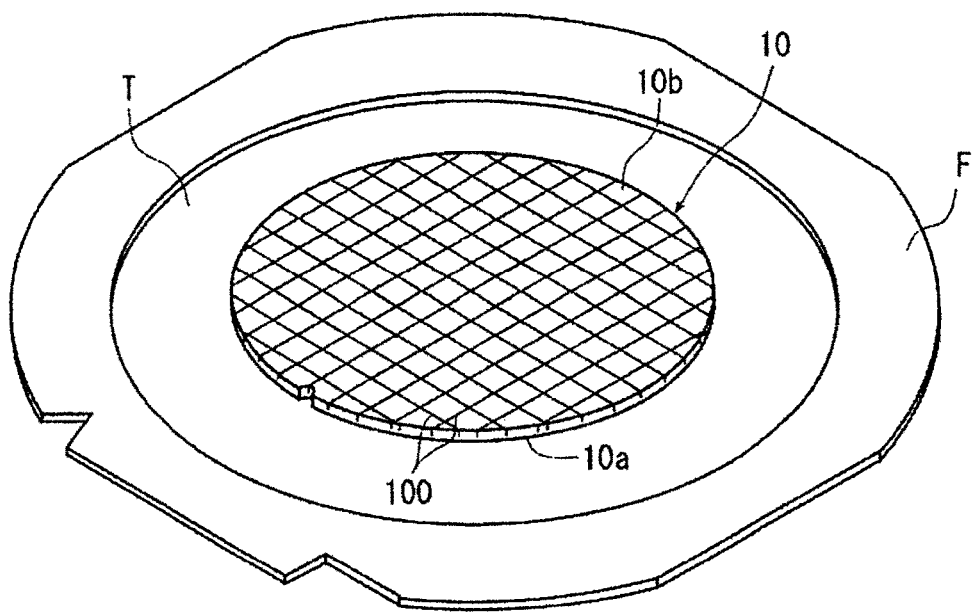
FIG. 4 is a perspective view of the wafer in the condition where the cut groove forming step is finished.

As illustrated in FIG. 3B, a functional layer 10c including a plurality of low-k films stacked is formed on the front side 10a of the wafer 10. Accordingly, the bottom of the cut groove 100 does not reach the functional layer 10c formed on the front side 10a of the wafer 10. The chuck table is rotatable about its axis. Accordingly, by rotating the chuck table, the rotational position of the wafer 10 with respect to the cutting blade 33 can be freely changed. That is, the direction of extension of the division lines 12 formed on the front side 10a of the wafer 10 can be changed. Accordingly, a plurality of similar cut grooves 100 can be formed on the back side 10b of the wafer 10 along all of the division lines 12 as illustrated in FIG. 4. Thus, the cut groove forming step is finished. In FIG. 3B, the cut groove 100 is illustrated so as to be emphasized for convenience of illustration, and the dimensions of the cut groove 100 illustrated are different from actual dimensions.

Figure 5A:
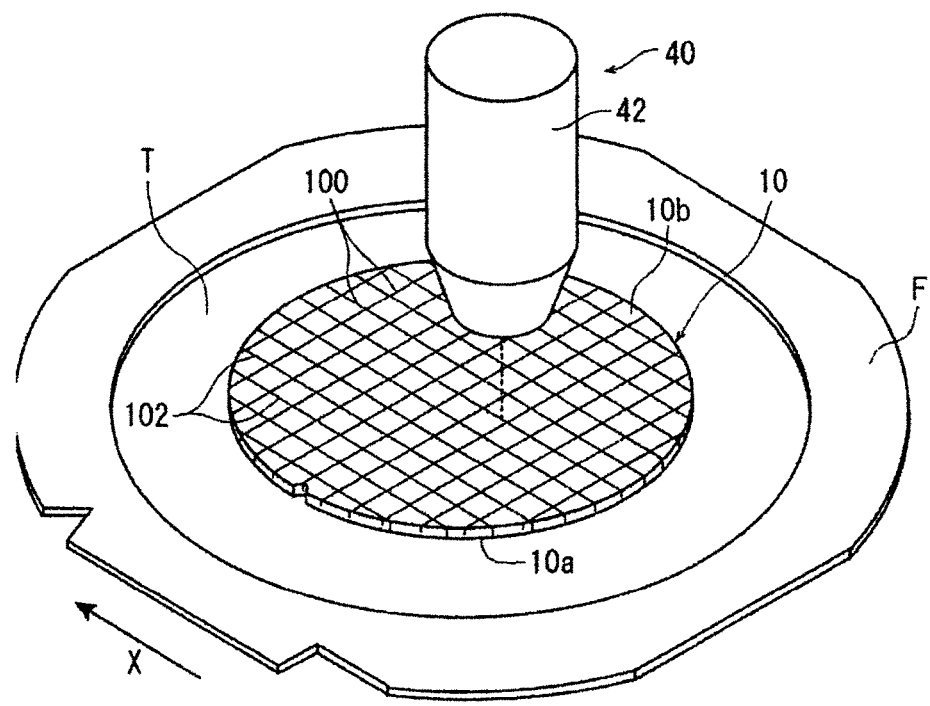
FIG. 5A is a perspective view illustrating a dividing step.

After performing the cut groove forming step, a dividing step is performed to divide the wafer 10 along each division line 12, i.e., along each cut groove 100 by using a laser processing apparatus (not illustrated in a general view) having laser processing means 40 illustrated in FIG. 5A. First, the wafer 10 processed by the cut groove forming step mentioned above is transferred to the laser processing apparatus. That is, the wafer 10 is placed on a chuck table (not illustrated) included in the laser processing apparatus in the condition where the back side 10b of the wafer 10 is oriented upward. That is, the adhesive tape T attached to the front side 10a of the wafer 10 is in contact with the upper surface (holding surface) of the chuck table in the laser processing apparatus. The chuck table is set below the laser processing means 40 as illustrated in FIG. 5A. As in the case of the grinding apparatus mentioned above, the holding surface of the chuck table in the laser processing apparatus is connected to suction means for producing a vacuum, so that the wafer 10 placed on the chuck table is held under suction by operating the suction means. Further, a plurality of (e.g., four) clamps for holding the annular frame F are preferably provided on the outer circumference of the chuck table in the laser processing apparatus. In this case, the annular frame F supporting the wafer 10 through the adhesive tape T is held by the clamps.

Figure 5B:
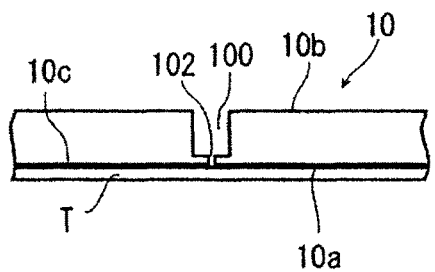
FIG. 5B is an enlarged sectional view of an essential part of the wafer processed by the dividing step.
Figure 6A:
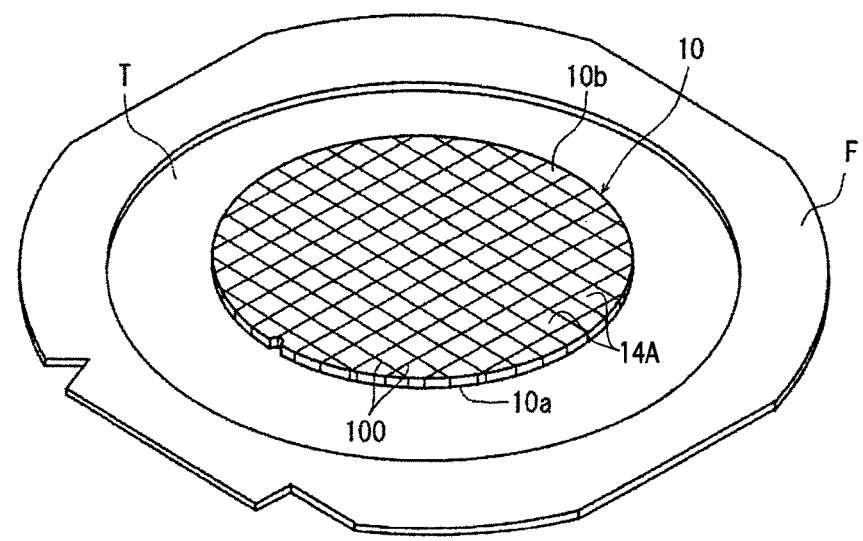
FIG. 6A is a perspective view of the wafer in the condition where the dividing step is finished.

As illustrated in FIG. 5A, the laser processing means 40 includes a laser head (focusing means) 42 for applying a laser beam having an absorption wavelength to the wafer 10. As in the case of the cutting apparatus mentioned above, the laser processing apparatus also includes imaging means (not illustrated) for imaging the front side 10a of the wafer 10 to detect the division lines 12 formed on the front side 10a of the wafer 10. In the condition where the wafer 10 is held on the chuck table under suction, alignment is performed by using this imaging means in such a manner that a target one of the division lines 12 is aligned with the laser head 42. Thereafter, the laser beam is applied from the laser head 42 to the wafer 10 from the back side 10b thereof at the position corresponding to the target division line 12 according to the position information obtained by the above alignment. At the same time, the chuck table is moved relative to the laser head 42 in a feeding direction (the direction illustrated by an arrow X in FIG. 5A). Accordingly, as illustrated in FIG. 5B which is an enlarged sectional view of an essential part of the wafer 10 processed by the laser beam, a laser processed groove 102 is formed on the bottom of the cut groove 100 along the target division line 12, in which the laser processed groove 102 has a depth from the bottom of the cut groove 100 to the front side (lower surface) of the functional layer 10c formed on the front side 10a of the wafer 10. That is, the laser processed groove 102 is so formed as to fully cut the wafer 10 with the functional layer 10c along the target division line 12. The chuck table is adapted to be changed in position relative to the laser head 42 by position changing means (not illustrated). Accordingly, by operating the position changing means, a plurality of similar laser processed grooves 102 can be formed along all of the division lines 12 of the wafer 10, thereby dividing the wafer 10 into a plurality of individual device chips 14A corresponding to the respective plural devices 14 as illustrated in FIG. 6A. Thus, the dividing step is finished.

For example, the dividing step is performed under the following laser processing conditions.

Light source: YAG pulsed laser
Wavelength: 355 nm (Third harmonic of YAG laser)
Power: 3.0 W
Repetition frequency: 20 kHz
Feed speed: 100 mm/second After performing the dividing step, a pickup step is performed to pick up each device chip 14A from the adhesive tape T. In the wafer processing method according to the present invention, the wafer 10 is divided into the individual device chips 14A by forming the laser processed grooves 102 along the division lines 12 in the dividing step, and the individual device chips 14A in the form of the wafer 10 are kept attached to the adhesive tape T supported to the annular frame F as illustrated in FIG. 6A. Accordingly, the pickup step can be performed to the wafer 10 in the condition illustrated in FIG. 6A. The pickup step is performed by using a pickup apparatus 60, a part of which being illustrated in FIG. 6B. The pickup apparatus 60 includes a frame holding member 61 having an upper surface for mounting the annular frame F, a plurality of clamps 62 provided on the outer circumference of the frame holding member 61 for holding the annular frame F mounted on the upper surface of the frame holding member 61, and a cylindrical expanding drum 63 for expanding the adhesive tape T supported to the annular frame F held by the clamps 62, thereby radially spreading the wafer 10 attached to the adhesive tape T. The expanding drum 63 has an upper opening. The frame holding member 61 is supported by supporting means 64 so as to be vertically movable. The supporting means 64 is composed of a plurality of air cylinders 64a arranged around the expanding drum 63 and a plurality of piston rods 64b individually extending from the upper ends of the air cylinders 64a and connected to the lower surface of the frame holding member 61.

Figure 6B:
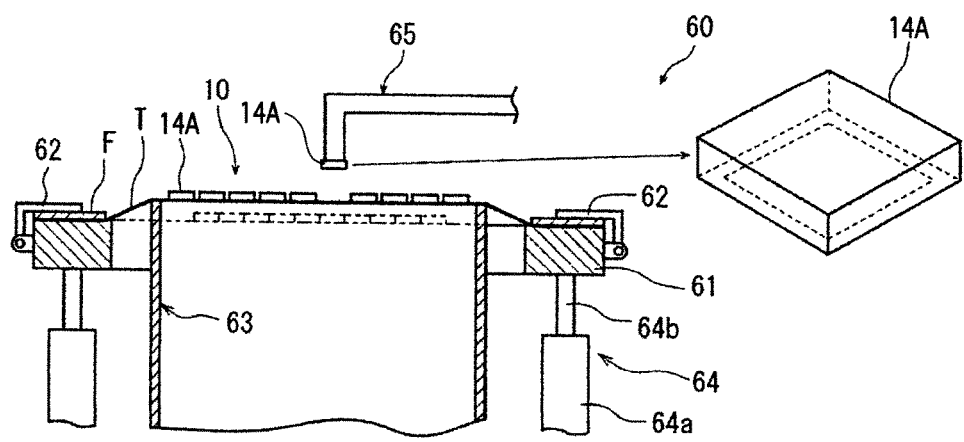
FIG. 6B is a sectional view illustrating a pickup step.

The expanding drum 63 has an outer diameter smaller than the inner diameter of the annular frame F and has an inner diameter larger than the diameter of the wafer 10 attached to the adhesive tape T supported to the annular frame F. As illustrated in FIG. 6B, the supporting means 64 functions to vertically move the frame holding member 61 so as to selectively take a reference position where the upper surface of the frame holding member 61 is substantially equal in height to the upper end of the expanding drum 63 as illustrated by a broken line and an expansion position where the upper surface of the frame holding member 61 is lower in height than the upper end of the expanding drum 63 as illustrated by a solid line. In other words, at the expansion position, the upper end of the expanding drum 63 is higher in level than the upper surface of the frame holding member 61. That is, the expansion position is obtained by operating the supporting means 64 to lower the frame holding member 61 from the reference position.

In operation, the wafer 10 supported through the adhesive tape T to the annular frame F is set in the pickup apparatus 60 in such a manner that the annular frame F is mounted on the upper surface of the frame holding member 61 at the reference position and then held by the clamps 62 in the condition where the back side 10b of the wafer 10 (already divided into the individual device chips 14A) is oriented upward. Thereafter, the frame holding member 61 is lowered to relatively raise the upper end of the expanding drum 63 from the reference position illustrated by the broken line to the expansion position illustrated by the solid line as illustrated in FIG. 6B. As a result, the adhesive tape T supported to the annular frame F is pushed up by the upper end of the expanding drum 63 and is thereby expanded. Accordingly, a tensile force is radially applied to the wafer 10 attached to the adhesive tape T, so that the individual device chips 14A divided from the wafer 10 by the laser processed grooves 102 in the dividing step mentioned above are displaced away from each other. That is, the spacing between any adjacent ones of the individual device chips 14A is increased by the expansion of the adhesive tape T. In the condition where the spacing between any adjacent ones of the individual device chips 14A is increased, a pickup collet 65 is operated to hold the back side (upper surface) of each device chip 14A under suction and then pick up each device chip 14A. Thereafter, each device chip 14A picked up is transferred to a bonding apparatus (not illustrated) for performing a bonding step of bonding the front side (lower surface) of each device chip 14A to a wiring board. Thus, the pickup step is finished to complete the wafer processing method according to the present invention.

According to the present invention described above, the following effects can be exhibited. The cut groove 100 is formed on the back side 10b of the wafer 10 along each division line 12 in the cut groove forming step using the cutting blade 33. Thereafter, the laser beam is applied to the bottom of the cut groove 100 from the back side 10b of the wafer 10 to thereby fully cut the wafer 10 along each division line 12. Accordingly, in forming the cut groove 100, no laser processed groove is present along each division line 12, so that it is possible to prevent the problem that the cutting blade 33 may be deviated or tilted or uneven wearing of the cutting blade 33 may occur.

Further, the laser beam is applied to the bottom of the cut groove 100 from the back side 10b of the wafer 10 to thereby fully cut the wafer 10 along each division line 12. Accordingly, there is no possibility that debris may stick to the front side 10a of the wafer 10. That is, the need for forming a protective film can be eliminated. Further, it is unnecessary to form two laser processed grooves along each division line 12 in the condition where the spacing between the two laser processed grooves is larger than the width of the cutting blade 33. That is, it is possible to prevent the problem that thermal strain may remain in the wafer 10 due to the application of the laser beam in plural passes along each division line 12, causing a reduction in die strength of each device chip 14A.

Further, after forming the cut groove 100 on the back side 10b of the wafer 10 along each division line 12 by using the cutting blade 33, the laser beam is applied to the bottom of the cut groove 100 from the back side 10b of the wafer 10 to thereby fully cut the wafer 10 along each division line 12 in the dividing step. Accordingly, it is unnecessary to increase the width of each division line 12, so that it is possible to prevent the problem that the number of devices 14 that can be formed on the wafer 10 may be decreased. In particular, since the laser beam is applied from the back side 10b of the wafer 10 to the bottom of the cut groove 100 to cut only a remaining part of the wafer 10 between the bottom of the cut groove 100 and the front side 10a of the wafer 10 (the front side of the functional layer 10c), it is possible to prevent the problem occurring in the case of applying the laser beam to the front side 10a of the wafer 10, that is, the problem that the laser beam passes through a passivation film to reach the functional layer 10c, so that the energy of the laser beam is confined in the functional layer 10c by the passivation film to cause the occurrence of undercut.

Further, the wafer supporting step of attaching the front side 10a of the wafer 10 to the adhesive tape T supported to the annular frame F is performed before performing the back grinding step. Accordingly, it is unnecessary to attach a protective tape to the wafer 10 at any time from the back grinding step to the dividing step. That is, it is unnecessary to invert the wafer 10. Further, the pickup step is performed in the condition where the individual device chips 14A obtained by fully cutting the wafer 10 are supported through the adhesive tape T to the annular frame F. Accordingly, it is unnecessary to peel the protective tape from the wafer. Since the back side of each device chip 14A is picked up from the adhesive tape T, the subsequent bonding step of bonding the front side of each device chip 14A to a wiring board can be performed efficiently and easily.

The present invention is not limited to the above preferred embodiment, but various modifications may be made. For example, while the wafer 10 is sequentially transferred to the chuck tables of the grinding apparatus, the cutting apparatus, and the laser processing apparatus in performing the back grinding step, the cut groove forming step, and the dividing step and then held on the chuck tables to perform the respective steps in the above preferred embodiment, these apparatuses may be integrated into a composite processing apparatus having a single chuck table for holding the wafer 10, in which the single chuck table may be moved to each dedicated apparatus in performing each step. In this case, it is unnecessary to transfer the wafer 10 between the dedicated apparatuses and change the chuck tables for holding the wafer 10.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer into a plurality of individual device chips along a plurality of crossing division lines, said division lines being formed on a front side of said wafer to thereby define a plurality of separate regions where a plurality of devices are individually formed, said device chips corresponding to said respective devices, said wafer processing method comprising:
   a wafer supporting step of attaching an adhesive tape to the front side of said wafer and attaching a peripheral portion of said adhesive tape to an annular frame having an inside opening for receiving said wafer, thereby supporting said wafer through said adhesive tape to said annular frame;
   a back grinding step of grinding a back side of said wafer to thereby reduce the thickness of said wafer after performing said wafer supporting step;
   a cut groove forming step of cutting the back side of said wafer along each division line by using a cutting blade after performing said back grinding step, thereby forming a cut groove on the back side of said wafer along each division line, said cut groove having a depth not reaching the front side of said wafer;
   a dividing step of applying a laser beam to the bottom of said cut groove from the back side of said wafer along each division line after performing said cut groove forming step, thereby dividing said wafer along each division line to obtain said individual device chips; and
   a pickup step of picking up each device chip from said adhesive tape after performing said dividing step.

* * * * *